US010651853B1

(12) United States Patent
Kong et al.

(10) Patent No.: US 10,651,853 B1
(45) Date of Patent: May 12, 2020

(54) TIMING INSULATION CIRCUITRY FOR PARTIAL RECONFIGURATION OF PROGRAMMABLE INTEGRATED CIRCUITS

(71) Applicant: Xilinx, Inc., San Jose, CA (US)

(72) Inventors: Raymond Kong, San Jose, CA (US); Hao Yu, Broomfield, CO (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 16/421,399

(22) Filed: May 23, 2019

(51) Int. Cl.
*H03K 19/17756* (2020.01)
*H03K 19/17728* (2020.01)
*H03K 19/17736* (2020.01)
*H03K 19/1776* (2020.01)
*G06F 30/34* (2020.01)
*G06F 30/392* (2020.01)
*G06F 30/394* (2020.01)
*G06F 30/3312* (2020.01)

(52) U.S. Cl.
CPC ... *H03K 19/17756* (2013.01); *G06F 30/3312* (2020.01); *G06F 30/34* (2020.01); *G06F 30/392* (2020.01); *G06F 30/394* (2020.01); *H03K 19/1774* (2013.01); *H03K 19/1776* (2013.01); *H03K 19/17728* (2013.01)

(58) Field of Classification Search
CPC ......... H03K 19/17756; H03K 19/1774; H03K 19/17728; H03K 19/1776; G06F 17/5072; G06F 17/5031; G06F 17/5077; G06F 17/5054
USPC ........................................................... 326/38
See application file for complete search history.

(56) References Cited

U.S. PATENT DOCUMENTS

| | | | |
|---|---|---|---|
| 6,091,263 | A | 7/2000 | New et al. |
| 6,150,839 | A | 11/2000 | New et al. |
| 6,204,687 | B1 | 3/2001 | Schultz et al. |
| 6,462,579 | B1 | 10/2002 | Camilleri et al. |
| 6,507,211 | B1 | 1/2003 | Schultz et al. |
| 6,525,562 | B1 | 2/2003 | Schultz et al. |
| 6,526,557 | B1 | 2/2003 | Young et al. |
| 6,573,748 | B1 | 6/2003 | Trimberger |
| 6,625,794 | B1 | 9/2003 | Trimberger |
| 6,759,869 | B1 | 7/2004 | Young et al. |
| 6,810,514 | B1 | 10/2004 | Alfke et al. |
| 6,836,842 | B1 | 12/2004 | Guccione et al. |
| 6,907,595 | B2 | 6/2005 | Curd et al. |
| 7,024,651 | B1 | 4/2006 | Camilleri et al. |

(Continued)

OTHER PUBLICATIONS

Xilinx, Inc., "SDAccel Environment User Guide," UG1023 (v2018.3), Jan. 24, 2019, 165 pg, San Jose, CA USA.

(Continued)

*Primary Examiner* — Don P Le
(74) *Attorney, Agent, or Firm* — Kevin T. Cuenot

(57) ABSTRACT

A device includes a platform implemented in programmable circuitry of the device. The platform is configured to communicate with a host data processing system. The device includes a first partial reconfiguration region implemented in the programmable circuitry and coupled to the platform. The first partial reconfiguration region is reserved for implementing user-specified circuitry. The device includes timing insulation circuitry implemented in the programmable circuitry and configured to isolate timing of signals passing between the platform and the first partial reconfiguration region.

20 Claims, 9 Drawing Sheets

(56) References Cited

U.S. PATENT DOCUMENTS

| | | |
|---|---|---|
| 7,057,413 B1 | 6/2006 | Young et al. |
| 7,109,750 B2 | 9/2006 | Vadi et al. |
| 7,124,338 B1 | 10/2006 | Mark et al. |
| 7,138,820 B2 | 11/2006 | Goetting et al. |
| 7,218,137 B2 | 5/2007 | Vadi et al. |
| 7,224,184 B1 | 5/2007 | Levi et al. |
| 7,233,532 B2 | 6/2007 | Vadi et al. |
| 7,235,999 B2 | 6/2007 | Goetting et al. |
| 7,302,625 B1 | 11/2007 | Payakapan et al. |
| 7,477,072 B1 | 1/2009 | Kao et al. |
| 7,478,357 B1 | 1/2009 | Mason et al. |
| 7,482,836 B2 | 1/2009 | Levi et al. |
| 7,509,617 B1 | 3/2009 | Young |
| 7,518,396 B1 | 4/2009 | Kondapalli et al. |
| 7,546,572 B1 | 6/2009 | Ballagh et al. |
| 7,599,299 B2 | 10/2009 | Goetting et al. |
| 7,619,442 B1 | 11/2009 | Mason et al. |
| 7,640,527 B1 | 12/2009 | Dorairaj et al. |
| 7,724,815 B1 | 5/2010 | Raha et al. |
| 7,746,099 B1 | 6/2010 | Chan et al. |
| 8,102,188 B1 | 1/2012 | Chan et al. |
| 8,359,448 B1 | 1/2013 | Neuendorffer |
| 8,415,974 B1 | 4/2013 | Lysaght |
| 8,719,750 B1 | 5/2014 | Balzli, Jr. |
| 8,928,351 B1 | 1/2015 | Konduru |
| 9,425,802 B1 * | 8/2016 | Xiao ............... H03K 19/17756 |
| 9,722,613 B1 | 8/2017 | Schultz et al. |
| 10,108,875 B2 * | 10/2018 | Tamai ................ G06K 9/4614 |
| 2018/0083633 A1 * | 3/2018 | Ganusov ............ H03K 19/1776 |
| 2019/0042533 A1 * | 2/2019 | Custodio ............ G06F 15/7867 |

OTHER PUBLICATIONS

U.S. Appl. No. 16/041,602, filed Jul. 20, 2018, San Jose, CA USA.
U.S. Appl. No. 16/141,723, filed Sep. 25, 2018, San Jose, CA USA.

* cited by examiner

1100

Include timing insulation circuitry in circuit design for platform
1102

↓

Process circuit design for platform through design flow
1104

↓

Mark placement and routing information for timing insulation circuitry
1106

↓

Generate configuration bitstreams for platform
1108

↓

Process modified version of dynamic platform circuitry of platform through design flow while preserving placement and routing information for timing insulation circuitry
1110

↓

Generate configuration bitstream implementing modified version of platform circuitry for implementation in platform PR region
1112

FIG. 11

TIMING INSULATION CIRCUITRY FOR PARTIAL RECONFIGURATION OF PROGRAMMABLE INTEGRATED CIRCUITS

TECHNICAL FIELD

This disclosure relates to integrated circuits (ICs) and, more particularly, to partial reconfiguration for a programmable IC.

BACKGROUND

A programmable integrated circuit (IC) refers to a type of device that includes programmable circuitry. An example of a programmable IC is a field programmable gate array (FPGA). An FPGA is characterized by the inclusion of programmable circuit blocks. Examples of programmable circuit blocks include, but are not limited to, input/output blocks (IOBs), configurable logic blocks (CLBs), dedicated random access memory blocks (BRAM), digital signal processing blocks (DSPs), processors, clock managers, and delay lock loops (DLLs).

Typically, each programmable circuit block includes programmable interconnects and programmable logic (referred to collectively as "programmable circuitry"). Programmable interconnects typically include a large number of interconnect lines of varying lengths interconnected by programmable interconnect points (PIPs). Programmable logic implements the logic of a user design using programmable elements that may include, for example, function generators, registers, arithmetic logic, and so forth.

The programmable circuitry may be programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Some programmable ICs may be partially reconfigured. Partial reconfiguration refers to a capability in which a region of programmable circuitry of the device is reconfigured by loading different configuration data therein to implement different circuitry in the region than was previously implemented. The region is a portion of the available programmable circuitry on the device. Other portions of programmable circuitry of the device not included in the region may implement circuit design(s) that continue to operate uninterrupted by reconfiguration of the region. Partial reconfiguration allows the programmable IC to implement different circuit designs in a designated region over time while other neighboring and/or surrounding programmable circuitry of the device continues to operate without interruption.

SUMMARY

In one aspect, a device includes a platform implemented in programmable circuitry of the device. The platform is configured to communicate with a host data processing system. The device includes a first partial reconfiguration region implemented in the programmable circuitry and coupled to the platform. The first partial reconfiguration region is reserved for implementing user-specified circuitry. The device also includes timing insulation circuitry implemented in the programmable circuitry and configured to isolate timing of signals passing between the platform and the first partial reconfiguration region.

In another aspect, a method includes providing a platform implemented in programmable circuitry of a device, wherein the platform is configured to communicate with a host data processing system, and providing a first partial reconfiguration region implemented in the programmable circuitry and coupled to the platform. The first partial reconfiguration region is reserved for implementing user-specified circuitry. The method also includes providing timing insulation circuitry implemented in the programmable circuitry and configured to isolate timing of signals passing between the platform and the first partial reconfiguration region and implementing a modified version of the platform in the device while keeping the timing insulation circuitry unchanged.

This Summary section is provided merely to introduce certain concepts and not to identify any key or essential features of the claimed subject matter. Other features of the inventive arrangements will be apparent from the accompanying drawings and from the following detailed description.

BRIEF DESCRIPTION OF THE DRAWINGS

The inventive arrangements are illustrated by way of example in the accompanying drawings. The drawings, however, should not be construed to be limiting of the inventive arrangements to only the particular implementations shown. Various aspects and advantages will become apparent upon review of the following detailed description and upon reference to the drawings.

FIG. 11 illustrates another example method of implementing a platform for a programmable IC.

DETAILED DESCRIPTION

Figure 1:
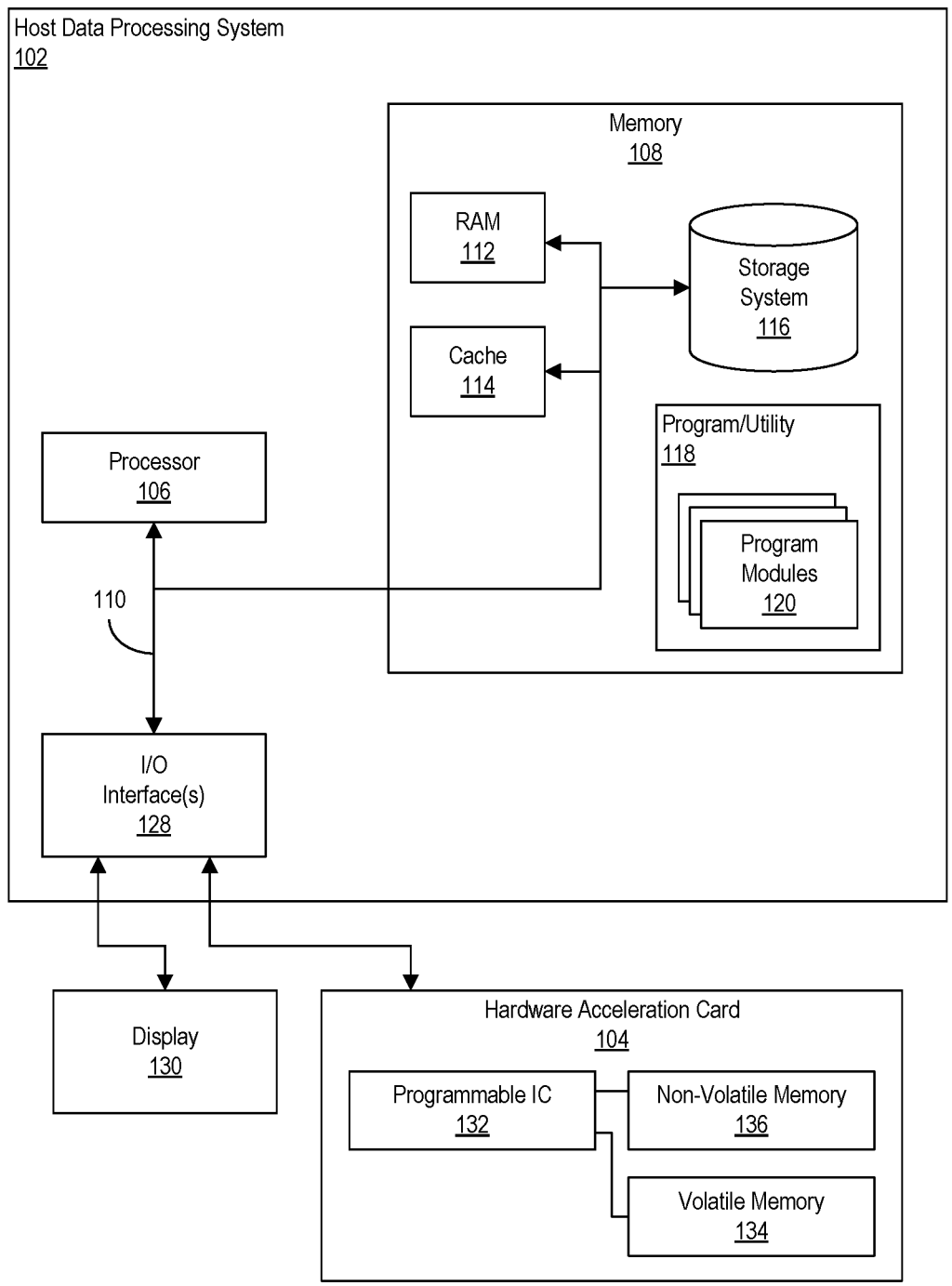
FIG. 1 illustrates an example computing environment for use with the inventive arrangements described within this disclosure.

While the disclosure concludes with claims defining novel features, it is believed that the various features described within this disclosure will be better understood from a consideration of the description in conjunction with the drawings. The process(es), machine(s), manufacture(s) and any variations thereof described herein are provided for purposes of illustration. Specific structural and functional details described within this disclosure are not to be interpreted as limiting, but merely as a basis for the claims and as a representative basis for teaching one skilled in the art to variously employ the features described in virtually any appropriately detailed structure. Further, the terms and phrases used within this disclosure are not intended to be limiting, but rather to provide an understandable description of the features described.

This disclosure relates to integrated circuits (ICs) and, more particularly, to partial reconfiguration for a programmable IC. In accordance with the inventive arrangements described herein, a programmable IC is used to provide a platform for implementing user-specified circuitry. The platform implemented in the programmable IC provides a circuit architecture that is capable of communicating with a host data processing system. The user-specified circuitry, or "kernels," are hardware accelerated applications or circuit designs implemented in programmable circuitry of the programmable IC. Kernels may be implemented in the programmable IC under control of the host data processing system and, for example, a user-specified application executing in the host data processing system that requests implementation of different kernels in the programmable IC over time. The kernels are designed to couple to, or integrate with, the platform.

The platform allows the programmable IC to maintain connectivity, e.g., a communication link, with the host data processing system while different kernels are dynamically inserted, removed, and/or modified within the programmable IC over time. In addition to allowing the programmable IC to remain in communication with the host data processing system, the platform also allows kernel developers to focus their efforts on the particular operations to be performed by the kernels and not on the underlying infrastructure needed to move data into the kernel, out of the kernel, and/or exchange data between the programmable IC and the host data processing system.

In some data center environments, the platform implemented in the programmable IC is created and/or provided by the data center vendor. The kernels may be custom user-specified circuitry or pre-designed circuits selected by the user (e.g., where the user in this example is the data center customer) by way of the user-specified application executing in the host data processing system. This type of arrangement may be used with Field Programmable Gate Array (FGPA)-as-a-Service or "FaaS."

It is not uncommon for platform providers to modify a platform over time. For example, a data center vendor may release an updated version of a platform to fix a bug, provide an incremental improvement to the platform, and/or provide a new feature in the platform. Since kernels are implemented against the platform available at the time (e.g., a particular platform), changes to the platform may render prior implemented kernels incompatible with the updated version of the platform. This means that each user may need to re-implement their kernels for use with the updated version of the platform. Re-implementation typically entails performing one or more stages of a design flow (e.g., synthesis, placement, and routing) anew. This is often a time consuming endeavor. Appreciably, in a data center environment, updating a platform may render many kernels across many different customers incompatible.

The inventive arrangements described within this disclosure address the incompatibility of implemented kernels with modified and/or updated platforms. Timing insulation circuitry is incorporated into the programmable IC to isolate timing of the user kernels from that of the platform. The timing insulation circuitry is implemented at or about the boundary between the platform and the partially reconfigurable (PR) region, or regions, used to implement kernels. For purposes of discussion, a PR region used to implement a user kernel (e.g., a user circuit design) is referred to herein as a "user PR region." The timing insulation circuitry may be used to convey signals exchanged between the platform and the user PR region(s). By incorporating the timing insulation circuitry, the platform may be modified without affecting compatibility of the kernels. In short, kernels that were implemented and compatible with the platform will also be compatible with the updated version of the platform.

Further aspects of the inventive arrangements are described below in greater detail with reference to the figures. For purposes of simplicity and clarity of illustration, elements shown in the figures have not necessarily been drawn to scale. For example, the dimensions of some of the elements may be exaggerated relative to other elements for clarity. Further, where considered appropriate, reference numbers are repeated among the figures to indicate corresponding, analogous, or like features.

FIG. 1 illustrates an example computing environment 100 for use with the inventive arrangements described within this disclosure. The computing environment includes a host data processing system (host system) 102 coupled to a hardware acceleration card (card) 104. The components of host system 102 may include, but are not limited to, one or more processors 106 (e.g., central processing units), a memory 108, and a bus 110 that couples various system components including memory 108 to processor(s) 106. Processor(s) 106 may include any of a variety of processors that are capable of executing program code. Example processor types include, but are not limited to, processors having an x86 type of architecture (IA-32, IA-64, etc.), Power Architecture, ARM processors, and the like.

Bus 110 represents one or more of any of several types of communication bus structures, including a memory bus or memory controller, a peripheral bus, an accelerated graphics port, and a processor or local bus using any of a variety of available bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, Peripheral Component Interconnect (PCI) bus, and PCI Express (PCIe) bus.

Host system 102 typically includes a variety of computer readable media. Such media may be any available media that is accessible by host system 102 and may include any combination of volatile media, non-volatile media, removable media, and/or non-removable media.

Memory 108 may include computer readable media in the form of volatile memory, such as random-access memory (RAM) 112 and/or cache memory 114. Host system 102 may also include other removable/non-removable, volatile/non-volatile computer system storage media. By way of example, storage system 116 may be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each may be connected to bus 110 by one or more data media interfaces. As will be further depicted and described below, memory 108 may include at least one computer program product having a set (e.g., at least one) of program modules (e.g., program code) that are configured to carry out the functions and/or operations described within this disclosure.

For example, program/utility 118, having a set (at least one) of program modules 120 which may include, but are not limited to, an operating system, one or more application programs (e.g., user applications), other program modules, and/or program data, is stored in memory 108. Program modules 120 generally carry out the functions and/or methodologies as described herein at least with respect to operations performed by host system 102. For example, program modules 120 may implement a software stack. The software stack may implement a runtime environment capable of performing the host system 102 operations described herein. In one aspect, program modules 120 includes a driver or daemon capable of communicating with programmable IC 132.

Program/utility 118 is executable by processor(s) 106. Program/utility 118 and any data items used, generated, and/or operated upon by processor(s) 106 are functional data structures that impart functionality when employed by processor(s) 106. As defined within this disclosure, a "data structure" is a physical implementation of a data model's organization of data within a physical memory. As such, a data structure is formed of specific electrical or magnetic structural elements in a memory. A data structure imposes physical organization on the data stored in the memory as used by an application program executed using a processor.

Host system 102 may include one or more Input/Output (I/O) interfaces 128 communicatively linked to bus 110. I/O interface(s) 128 allow host system 102 to communicate with external devices, couple to external devices that allow user(s) to interact with host system 102, couple to external devices that allow host system 102 to communicate with other computing devices, and the like. For example, host system 102 may be communicatively linked to a display 130 and to hardware acceleration card 104 through I/O interface(s) 128. Host system 102 may be coupled to other external devices such as a keyboard (not shown) via I/O interface(s) 128. Examples of I/O interfaces 128 may include, but are not limited to, network cards, modems, network adapters, hardware controllers, etc.

In an example implementation, the I/O interface 128 through which host system 102 communicates with hardware acceleration card 104 is a PCIe adapter. Hardware acceleration card 104 may be implemented as a circuit board that couples to host system 102. Hardware acceleration card 104 may, for example, be inserted into a card slot, e.g., an available bus and/or PCIe slot, of host system 102.

Hardware acceleration card 104 includes a programmable IC 132. Hardware acceleration card 104 also includes volatile memory 134 coupled to programmable IC 132 and a non-volatile memory 136 also coupled to programmable IC 132. Volatile memory 134 may be implemented as a RAM that is external to programmable IC 132, but is still considered a "local memory" of programmable IC 132, whereas memory 108, being within host system 102, is not considered local to programmable IC 132. In some implementations, volatile memory 134 may include multiple gigabytes of RAM, e.g., 64 GB of RAM. Non-volatile memory 136 may be implemented as flash memory. Non-volatile memory 136 is also external to programmable IC 132 and may be considered local to programmable IC 132.

FIG. 1 is not intended to suggest any limitation as to the scope of use or functionality of the examples described herein. Host system 102 is an example of computer hardware (e.g., a system) that is capable of performing the various operations described within this disclosure relating to hardware acceleration card 104 and/or programmable IC 132.

Host system 102 is only one example implementation of a computer that may be used with a hardware acceleration card. Host system 102 is shown in the form of a computing device, e.g., a computer or server. Host system 102 can be practiced as a standalone device, as a bare metal server, in a cluster, or in a distributed cloud computing environment. In a distributed cloud computing environment, tasks are performed by remote processing devices that are linked through a communications network. In a distributed cloud computing environment, program modules may be located in both local and remote computer system storage media including memory storage devices.

As used herein, the term "cloud computing" refers to a computing model that facilitates convenient, on-demand network access to a shared pool of configurable computing resources such as networks, servers, storage, applications, ICs (e.g., programmable ICs) and/or services. These computing resources may be rapidly provisioned and released with minimal management effort or service provider interaction. Cloud computing promotes availability and may be characterized by on-demand self-service, broad network access, resource pooling, rapid elasticity, and measured service.

Some computing environments, e.g., cloud computing environments and/or edge computing environments using host system 102 or other suitable data processing system, generally support the FPGA-as-a-Service (FaaS) model. In the FaaS model, user functions are hardware accelerated as circuit designs implemented within programmable ICs operating under control of the (host) data processing systems. Other examples of cloud computing models are described in the National Institute of Standards and Technology (NIST) and, more particularly, the Information Technology Laboratory of NIST.

Host system 102 is operational with numerous other general-purpose or special-purpose computing system environments or configurations. Examples of computing systems, environments, and/or configurations that may be suitable for use with host system 102 include, but are not limited to, personal computer systems, server computer systems, thin clients, thick clients, hand-held or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Host system 102 is also an example implementation of an Electronic Design Automation (EDA) system. Program modules 120, for example, may include software that is capable of performing a design flow (e.g., synthesis, placement, routing, and/or bitstream generation) on a circuit design. In this regard, host system 102 serves as an example of an EDA system that is capable of processing circuit designs and/or generating configuration bitstreams as described herein.

Figure 2:
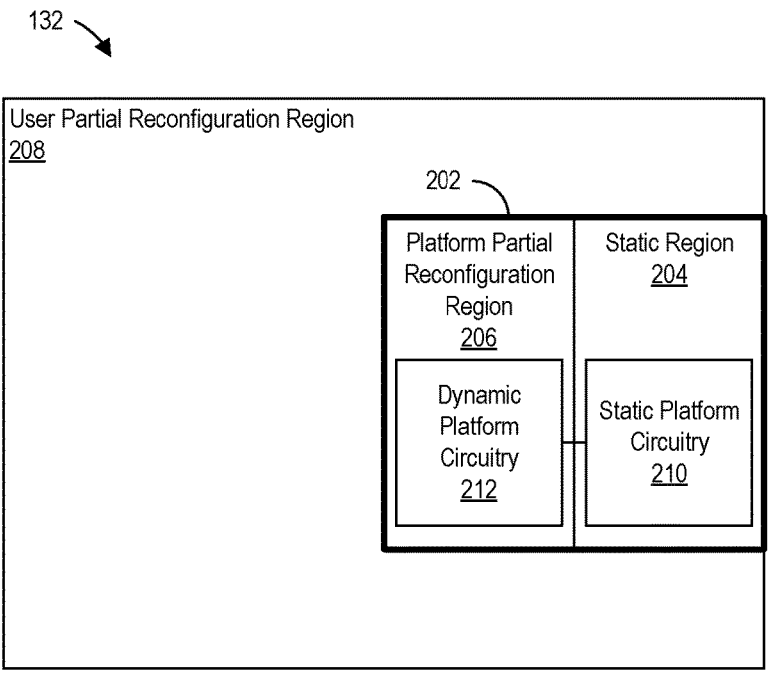
FIG. 2 illustrates an example layout for a platform and a user partial-reconfiguration (PR) region of a programmable integrated circuit (IC).

FIG. 2 illustrates an example layout for a platform and a user PR region of a programmable IC. In the example of FIG. 2, programmable IC 132 includes a platform 202. Platform 202 is circuitry implemented in programmable circuitry of programmable IC 132. Platform 202 facilitates communication between host system 102 and programmable IC 132 including any kernels implemented therein. The kernels are implemented in a user PR region 208, which is connected to platform 202.

Platform 202 is specified by a circuit design that is loaded into programmable IC 132. Once implemented in programmable IC 132, platform 202 provides host system interfaces and optionally memory interfaces for the duration of operation. Platform 202 may be implemented in programmable IC 132 by loading one or more configuration bitstreams therein.

In the example of FIG. 2, platform 202 includes static platform circuitry 210 implemented in static region 204 and dynamic platform circuitry 212 implemented in platform PR region 206. In one aspect, platform 202 is implemented by loading a first configuration bitstream to implement static platform circuitry 210 in static region 204 and a second configuration bitstream to implement dynamic platform circuitry 212 in platform PR region 206. In some cases, as described herein, static platform circuitry 210 may include additional programmable circuitry located external to static region 204 and/or external to platform PR region 206.

Static region 204 represents a region of programmable circuitry of programmable IC 132 that, once configured with a circuit design, implements components of platform 202 that do not change over time. Platform 202 may be provided by the manufacturer or provider of programmable IC 132. In one aspect, static platform circuitry 210 is capable of establishing a communication link between programmable IC 132 and host system 102. While static region 204 may be reconfigured (e.g., since the entirety of programmable IC 132 may be initialized and restarted), such an operation would take programmable IC 132 offline from host system 102 (e.g., disconnect the communication link established between programmable IC 132 and host system 102).

Platform PR region 206 represents a region of programmable circuitry of programmable IC 132. Platform PR region 206 implements other components of platform 202 that provide an interface between static region 204, user PR region 208, and optionally other resources such as off-chip memory (e.g., volatile memory 134 and/or non-volatile memory 136) and/or other hardwired circuit blocks that may be included in programmable IC 132. Dynamic platform circuitry 212 may be provided by the data center vendor. Platform PR region 206 may be reconfigured by loading a different configuration bitstream in programmable IC 132 without affecting or disrupting operation of static platform circuitry 210 in static region 204. As such, aspects of platform 202 may be updated over time dynamically without disconnecting the communication link between programmable IC 132 and host system 102.

User PR region 208 represents a region of programmable circuitry of programmable IC 132. User PR region 208 connects to platform PR region 206. User PR region 208 is used to implement one or more kernels specified by users (e.g., the end user). The kernels may have connections among themselves and/or to platform 202 via platform PR region 206. User PR region 208 may be dynamically reconfigured over time to implement different kernels therein. The kernels implemented in user PR region 208 are designed to connect to circuit block(s) of dynamic platform circuitry 212 implemented platform PR region 206.

In general, PR regions represent physical areas of programmable circuitry on programmable IC 132 that may be reconfigured. Each PR region may correspond to a reconfigurable module of a circuit design implemented in programmable IC 132 (e.g., in reference to the entire circuit structure implemented across programmable IC 132). In one aspect, each PR region must not intersect with any other PR region. During partial reconfiguration of a specific reconfigurable module, only the PR region corresponding to that particular reconfigurable module is reprogrammed.

While platform 202 and user PR region 208 are described as being implemented using programmable circuitry, it should be appreciated that platform 202 and/or user PR region 208 may include one or more hardwired circuit blocks. Further, while a single user PR region is illustrated in FIG. 2, programmable IC 132 may include a plurality of user PR regions each connected to platform 202.

Figure 3:
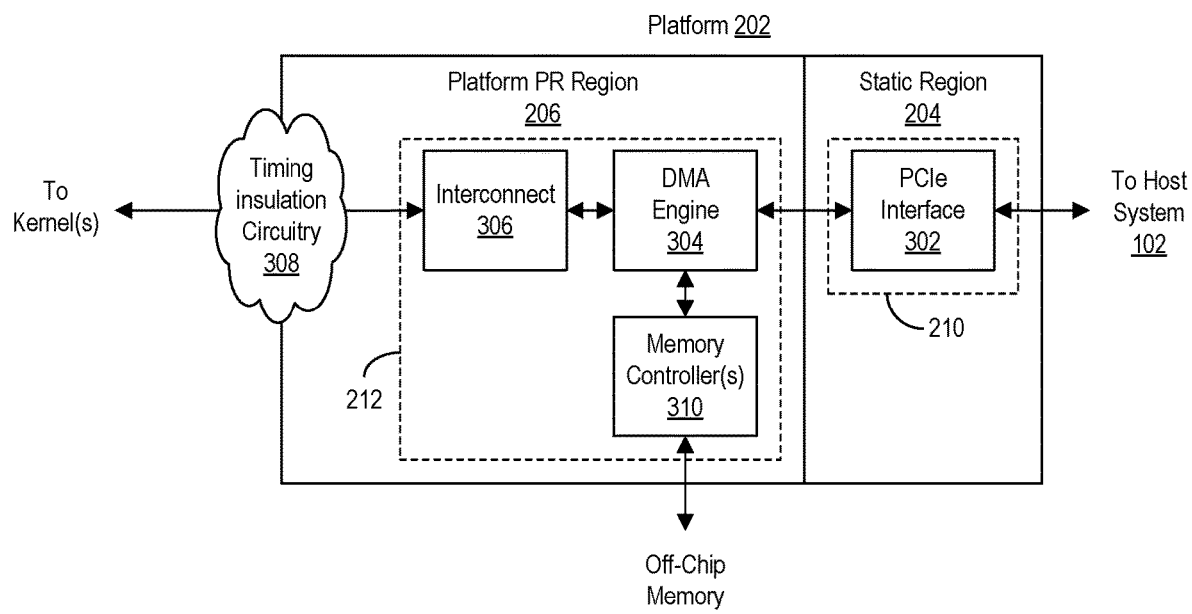
FIG. 3 illustrates an example implementation of the platform of FIG. 2.

FIG. 3 illustrates an example implementation of platform 202 of FIG. 2. FIG. 3 illustrates a more detailed example of static platform circuitry 210 and dynamic platform circuitry 212. In the example of FIG. 3, static platform circuitry 210 may include Peripheral Component Interconnect Express (PCIe) interface 302. Dynamic platform circuitry 212 may include a direct memory access (DMA) engine 304 and interconnect 306. DMA engine 304 is connected to PCIe interface 302 and to interconnect 306. Interconnect 306 may include a plurality of communication interfaces that may connect to timing insulation circuitry 308, which in turn connects to kernels implemented in user PR region 208. Dynamic platform circuitry 212 optionally includes one or more memory controllers 310 that are capable of connecting to volatile memory 134 (e.g., DDR memory) and/or non-volatile memory 136.

In an example implementation, interconnect 306 is implemented as an on-chip interconnect. An example of an on-chip interconnect is an Advanced Microcontroller Bus Architecture (AMBA) eXtensible Interface (AXI) bus. An AMBA AXI bus is an embedded microcontroller bus interface for use in establishing on-chip connections between circuit blocks and/or systems. AXI is provided as an illustrative example of a communication interface and is not intended as a limitation of the examples implementations described within this disclosure. Other examples of communication interfaces include, but are not limited to, other types of buses, a network-on-chip (NoC), a cross-bar, or other type of switch. Interconnect 306 may provide streaming interfaces, memory mapped interfaces, or a combination thereof.

In the example of FIG. 3, PCIe interface 302 is implemented in static region 204. The other circuit blocks (e.g., interconnect 306, DMA engine 304, and optional memory controller(s) 310) are implemented in platform PR region 206. Timing insulation circuitry 308 may be implemented outside of platform PR region 206 as part of static platform circuitry 210 or within platform PR region 206 as part of dynamic platform circuitry 212. As discussed, because platform 202 includes components such as PCIe interface 302, DMA engine 304, interconnect 306, and/or memory controller(s) 310, programmable IC 132 is capable of maintaining a communication link (e.g., a PCIe link) with host system 102 while user PR region 208 is dynamically reconfigured to insert, remove, and/or modify kernels implemented therein. Platform 202 may operate uninterrupted while user PR region 208 is dynamically reconfigured.

Further, platform PR region 206 may be dynamically reconfigured while static region 204 continues to operate uninterrupted. As such, platform 202 may be updated or modified while also maintaining the communication link with host system 102. With the inclusion of timing insulation circuitry 308 as described herein, platform 202 may be updated while any kernels implemented for use with a particular platform implementation maintain compatibility with an updated (e.g., modified) version of the platform.

It should be appreciated that the particular interface used to communicate with host system 102 implemented within static region 204 may be one other than PCIe, e.g., an endpoint configured to operate with any of the example bus architectures described herein in connection with host system 102.

Figure 4:
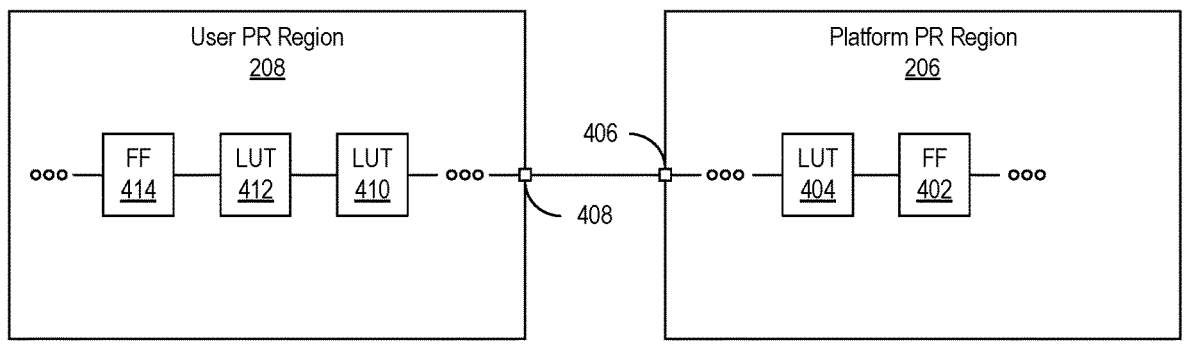
FIGS. 4 and 5, taken collectively, illustrate an example modification to a platform without use of timing insulation circuitry.
Figure 5:
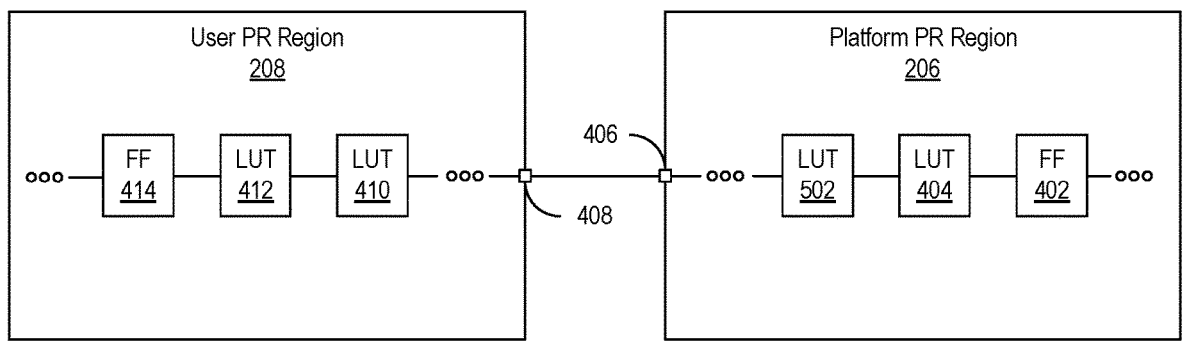

FIGS. 4 and 5, taken collectively, illustrate an example modification to platform 202 without use of timing insulation circuitry. More particularly, FIGS. 4 and 5 illustrate a modification to the dynamic platform circuitry within platform PR region 206 of platform 202.

In the example of FIG. 4, a signal path passing from the dynamic platform circuitry of platform PR region 206 to a kernel (e.g., one or more kernels or user circuitry) implemented in user PR region 208 is shown. The signal path traverses between platform PR region 206 and user PR region 208 with flip-flops (FFs) 402 and 414 as clocked endpoints. For purposes of illustration, the segment of the signal path shown starts at FF 402, continues to lookup table (LUT) 404, to port 406, traverses from platform PR region 206 to user PR region 208 entering port 408, continues to LUT 410, to LUT 412, and to FF 414. The signal path from FF 402 to FF 414 is also a timing path in that the endpoints (e.g., FF 402 and FF 414) are clocked circuit elements. The intervening circuit elements (e.g., LUT 404, LUT 410, and LUT 412) are not clocked (e.g., are combinatorial logic).

In the example of FIG. 5, platform 202 has been modified. The modification to platform 202 shown in FIG. 5 may be implemented by the platform provider for any of a variety of reasons. These reasons may include, but are not limited to, implementing a bug fix, providing an incremental enhancement to the platform, or adding a new feature to the platform. The modification to platform 202 may be implemented after a number of users (e.g., FaaS users) have built kernels for implementation in user PR region 208. Since these kernels are configured to connect to the prior version of platform 202 as shown in FIG. 4, the kernels are compatible with the version of platform 202 illustrated in FIG. 4.

FIG. 5 illustrates how a change to platform 202 and, in particular, to the dynamic platform circuitry in platform PR region 206, can change the timing of signals that pass between platform PR region 206 and user PR region 208. Within platform PR region 206, the number of logic levels has changed in the timing path from FF 402 to FF 414, which crosses PR region boundaries. LUT 502 has been inserted into the dynamic platform circuitry in the signal path passing between FF 402 of platform PR region 206 and FF 414 of user PR region 208. It should be appreciated that more than one LUT or other circuit component (e.g., combinatorial circuit element or unclocked circuit element) may be incorporated in the dynamic platform circuitry in platform PR region 206 between FF 402 and port 406. Further, additional modifications may be introduced into the dynamic platform circuitry that are not illustrated in FIG. 5.

The modification to platform 202 shown in FIG. 5 may render prior kernels implemented in user PR region 208 inoperable (e.g., function incorrectly) or incompatible (e.g., fail to meet timing) with the modified version of the platform shown in FIG. 5. For example, whereas a kernel may function correctly and meet timing when connected to the platform of FIG. 4, the kernel may not function correctly or may not meet timing when connected to the platform of FIG. 5. The modification to platform PR region 206 may negatively impact operability of the kernel and/or timing of signals that cross between platform PR region 206 and user PR region 208. In such cases, the users have no choice other than to re-implement all kernel designs to close timing. As the number of user designs (e.g., kernels) grows over time, the maintenance required for these designs can become unwieldy and pose a limitation on how scalable platform 202 is.

Figure 6:
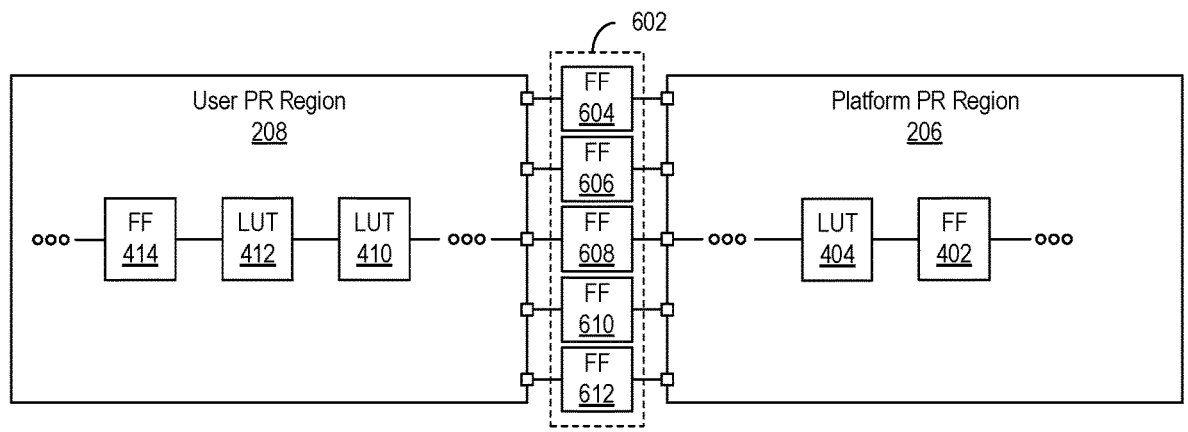
FIGS. 6 and 7, taken collectively, illustrate an example modification to a platform with timing insulation circuitry.
Figure 7:
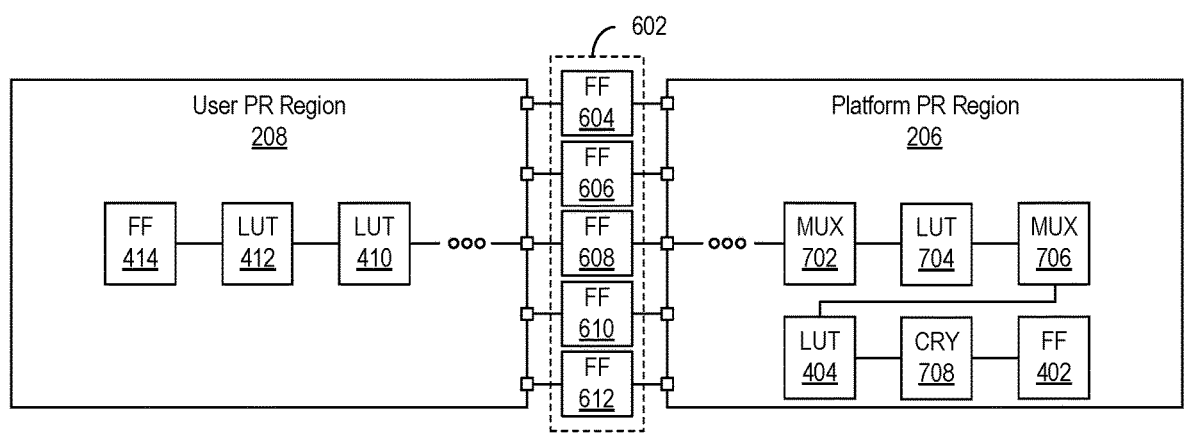

FIGS. 6 and 7, taken collectively, illustrate an example modification to platform 202 with timing insulation circuitry. More particularly, FIGS. 6 and 7 illustrate how the use of timing insulation circuitry addresses the operability and/or timing issues that may arise with modification of platform 202.

In the example of FIG. 6, timing insulation circuitry 602 is inserted into a region of programmable circuitry between platform PR region 206 and user PR region 208. More particularly, timing insulation circuitry 602 is located between a boundary of the user PR region 208 and a boundary of the platform PR region 206. In one aspect, the region of programmable circuitry in which timing insulation circuitry 602 is inserted is static circuitry. For example, the timing insulation circuitry is part of the static platform circuitry implemented in static region 204 of platform 202. Timing insulation circuitry 602 may include a FF placed on each signal passing between ports of user PR region 208 and ports of platform PR region 206. As shown, timing insulation circuitry 602 includes FFs 604, 606, 608, 610, and 612. It should be appreciated that fewer or more FFs than shown may be included in timing insulation circuitry 602 depending on the number of signals that pass between user PR region 208 and platform PR region 206. The inventive arrangements are not intended to be limited by the particular number of FFs shown.

In the example of FIG. 7, platform 202 is modified. The dynamic platform circuitry of platform PR region 206 is modified to include additional logic levels between FF 402 and the port of platform PR region 206. For example, multiplexers 702 and 706, LUT 704, and carry chain logic 708 are added. Timing insulation circuitry 602 insulates the timing of signal paths that pass between user PR region 208 and platform PR region 206. Modifications to platform 202 can be made transparently without any impact on timing for existing implementations of user designs. Use of timing insulation circuitry 602 allows platform 202 to scale as needed through continued modifications to platform PR region 206 without causing operability and/or timing issues to arise with user designs implemented in user PR region 208.

FIG. 7 illustrates that increased delays associated with the modifications introduced in the dynamic platform circuitry are completely insulated and contained within platform PR region 206. The timing of the signal path at the boundary between platform PR region 206 and user PR region 208, which is now FF 608 to FF 414 in user PR region 208, remains unchanged. Timing insulation circuitry 602, in this example, shields changes in platform PR region 206 from user PR region 206 and guarantees that the previous kernel (e.g., user design) implementations compatible with the platform of FIG. 6 will be compatible with the updated platform of FIG. 7.

In addition, the use of timing insulation circuitry 602 to separate two PR regions means that different combinations of user designs for user PR region 208 and designs for platform PR region 206 are compatible at the partial configuration bitstream level. Both timing and bitstream compatibility are achieved. Timing can be closed independently for a kernel (or kernels as the case may be) to be implemented in user PR region 208 and for the dynamic platform circuitry of platform 202.

Figure 8:
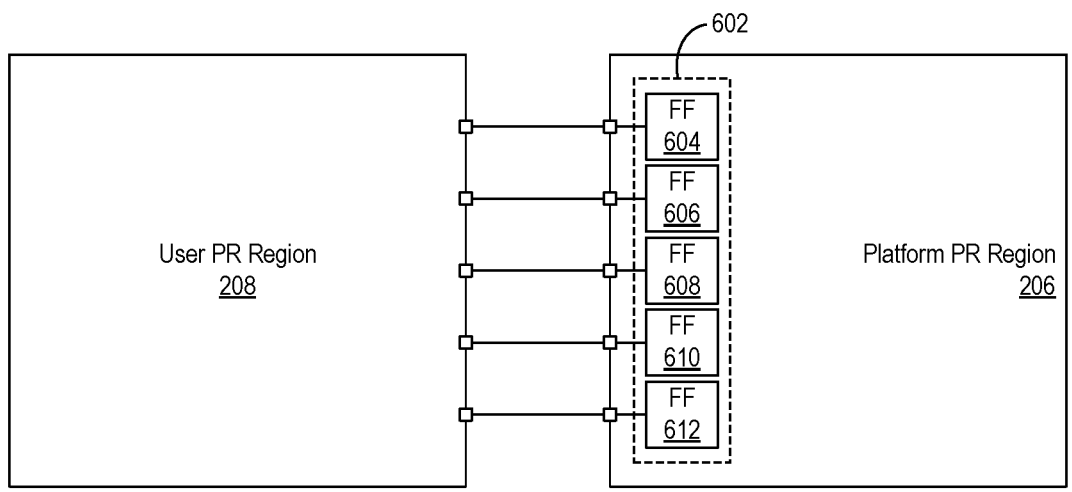
FIG. 8 illustrates another example implementation of timing insulation circuitry.

FIG. 8 illustrates another example implementation of timing insulation circuitry 602. In the example of FIG. 8, timing insulation circuitry 602 is implemented within platform PR region 206. Timing insulation circuitry 602 is implemented as part of the dynamic platform circuitry within platform PR region 206. Any modifications introduced into platform PR region 206 may be implemented in the signal paths to the right of FFs 604-612. This ensures that timing of the dynamic platform circuitry of platform PR region 206 is isolated from the timing of kernel(s) implemented in user PR region 208. Timing of signal paths from any of FFs 604-612 into user PR region 208 remain unchanged.

In the example of FIG. 8, timing insulation circuitry 602 is implemented within platform PR region 206 at a boundary of the user PR region 208 and the platform PR region 206. More particularly, timing insulation circuitry 602 is located within platform PR region 206 at a boundary of platform PR region 206 adjacent to a boundary of user PR region 208.

In the examples of FIGS. 7 and 8, the EDA system used to implement the platform is capable of adding timing insulation circuitry 602 into either the static region or the platform PR region. In either case, the EDA system is capable of marking the timing insulation circuitry 602. Once marked, the EDA system does not change the placement or routing of timing insulation circuitry for subsequent modifications to the platform. For example, the circuit design for the platform PR region is modified. When re-implemented, the EDA system does so without any change to the timing insulation circuitry. Prior placement and routing for the timing insulation circuitry in the prior version of the platform may be preserved and used in the modified version of the platform.

Figure 9:
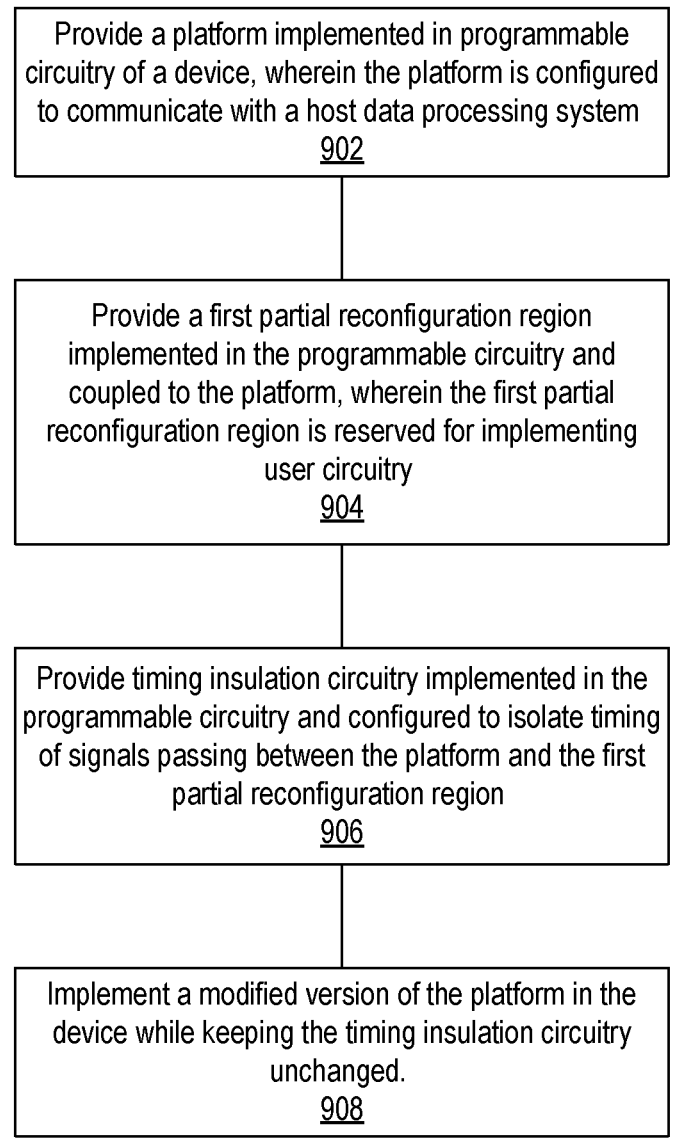
FIG. 9 illustrates an example method of implementing a platform for a programmable IC.

FIG. 9 illustrates an example method 900 of implementing a platform for a programmable IC. An EDA system as described in connection with FIG. 1 may perform the operations described in connection with FIG. 9.

In block 902, a platform is provided. The platform is implemented in programmable circuitry of a device (e.g., a programmable IC). The platform is configured to communicate with a host system.

In block 904, a first (e.g., user) PR region is provided. The first PR region is implemented in the programmable circuitry of the device. The first PR region is coupled to the platform. The first PR region is reserved for implementing user circuitry (e.g., kernels).

In block 906, timing insulation circuitry is provided. The timing insulation circuitry is implemented in the programmable circuitry of the device. The timing insulation circuitry is capable of isolating timing of signals passing between the platform (e.g., the platform PR region) and the first PR region.

In block 908, the EDA system is capable of implementing a modified version of the platform in the device. The modified version of the platform is implemented in the device while keeping the timing insulation circuitry unchanged. For example, updated or modified dynamic platform circuitry may be implemented in the platform PR region. This may be performed while the static platform circuitry continues to operate uninterrupted. Further, the user circuitry need not be reimplemented. In some cases, the user circuitry may continue to operate uninterrupted.

Figure 10:
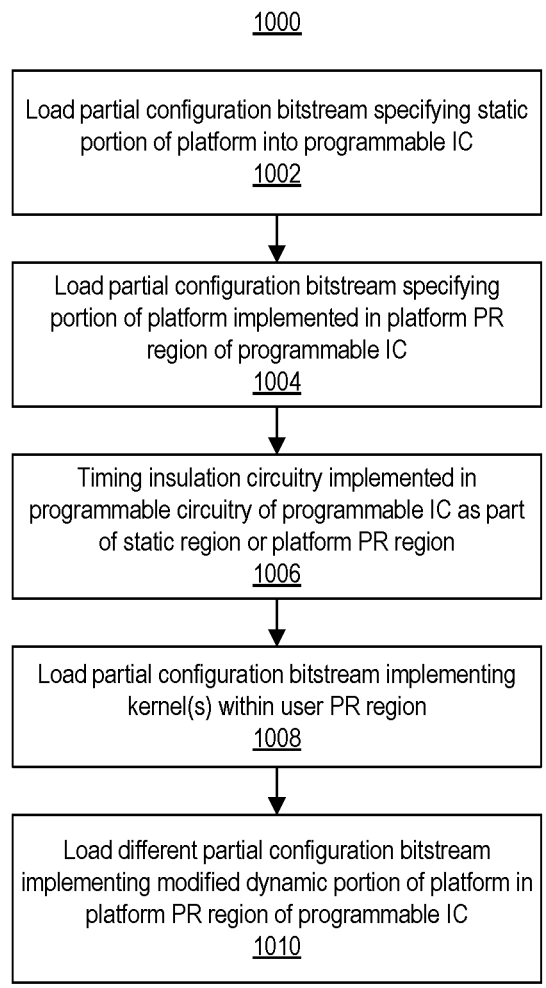
FIG. 10 illustrates another example method of implementing a platform for a programmable IC.

FIG. 10 illustrates another example method 1000 of implementing a platform for a programmable IC. Method 1000 may be performed by host system 102 as described herein in connection with FIG. 1.

In block 1002, the host system is capable of initiating the loading of a partial configuration bitstream into the programmable IC. The partial configuration bitstream loaded in block 1002 specifies the static platform circuitry of the platform implemented in the static region of the platform. In block 1004, the host system is capable of initiating the loading of another partial configuration bitstream into the programmable IC. The partial configuration bitstream loaded in block 1004 specifies the dynamic platform circuitry of the platform. The dynamic platform circuitry is the portion implemented in the platform PR region of the platform.

In block 1006, the timing insulation circuitry is implemented in the programmable circuitry of the programmable IC as part of the static region or the platform PR region. For example, when implemented as part of the static region, the timing insulation circuitry may be specified by the partial configuration bitstream of block 1002. When implemented as part of the platform PR region, the timing insulation circuitry may be specified by the partial configuration bitstream of block 1004.

In block 1008, the host system is capable of initiating the loading of a partial configuration bitstream implementing one or more kernels within the user PR region. The partial configuration bitstream loaded in block 1008 specifies user circuitry that connects to the timing insulation circuitry of the platform. As discussed, whether implemented as part of the dynamic platform circuitry within the platform PR region or as part of the static platform circuitry between the platform PR region and the user PR region, the timing insulation circuitry exists at the boundary between the platform PR region and the user PR region.

In block 1010, the host system is capable of initiating the loading of a different partial configuration bitstream that implements modified dynamic platform circuitry in the platform PR region of the programmable IC. The modified dynamic platform circuitry of the platform may include one or more modified signal paths that have endpoints corresponding to FFs of the timing insulation circuitry. As such, changes in the timing of these signal paths are isolated to within the platform PR region and do not extend into the user PR region.

FIG. 11 illustrates another example method 1100 of implementing a platform for a programmable IC. Method 1100 may be performed by an EDA system as described herein in connection with FIG. 1.

In block 1102, the EDA system is capable of including timing insulation circuitry in a circuit design for the platform. In block 1104, the EDA system is capable of processing the static platform circuitry in the dynamic platform circuitry of the circuit design for the platform through a design flow. For example, the EDA system is capable of synthesizing, placing, and routing the circuit design.

In block 1106, the EDA system is capable of marking the placement and routing information for the timing insulation circuitry. It should be appreciated that the EDA system is also capable of storing or preserving the placement and routing information for the timing insulation circuitry thereby allowing such information to be reused or preserved for subsequent modifications to the platform.

In block 1108, the EDA system is capable of generating configuration bitstreams for the platform. For example, the EDA system may generate a first partial configuration bitstream specifying a placed and routed version of the static platform circuitry of the platform. The EDA system may also generate a second partial configuration bitstream specifying a placed and routed version of the dynamic platform circuitry of the platform.

In block 1110, the EDA system is capable of processing modified version of the dynamic platform circuitry of the platform through the design flow. The EDA system processes the modified dynamic platform circuitry of the platform through the design flow while preserving the placement and routing information for the timing insulation circuitry.

In one aspect, where the timing insulation circuitry is included in the static platform circuitry, the modified dynamic platform circuitry of the platform is placed and routed to connect to the timing insulation circuitry (e.g., as in the example of FIG. 7). In another aspect, where the timing insulation circuitry is included in the dynamic platform circuitry of the platform, the placement and routing information for the timing insulation circuitry may be reused within the design flow of block 1110.

In block 1112, the EDA system is capable of generating a configuration bitstream specifying a placed and routed version of the modified dynamic platform circuitry of the platform for implementation in the platform PR region of the programmable IC.

Figure 12:
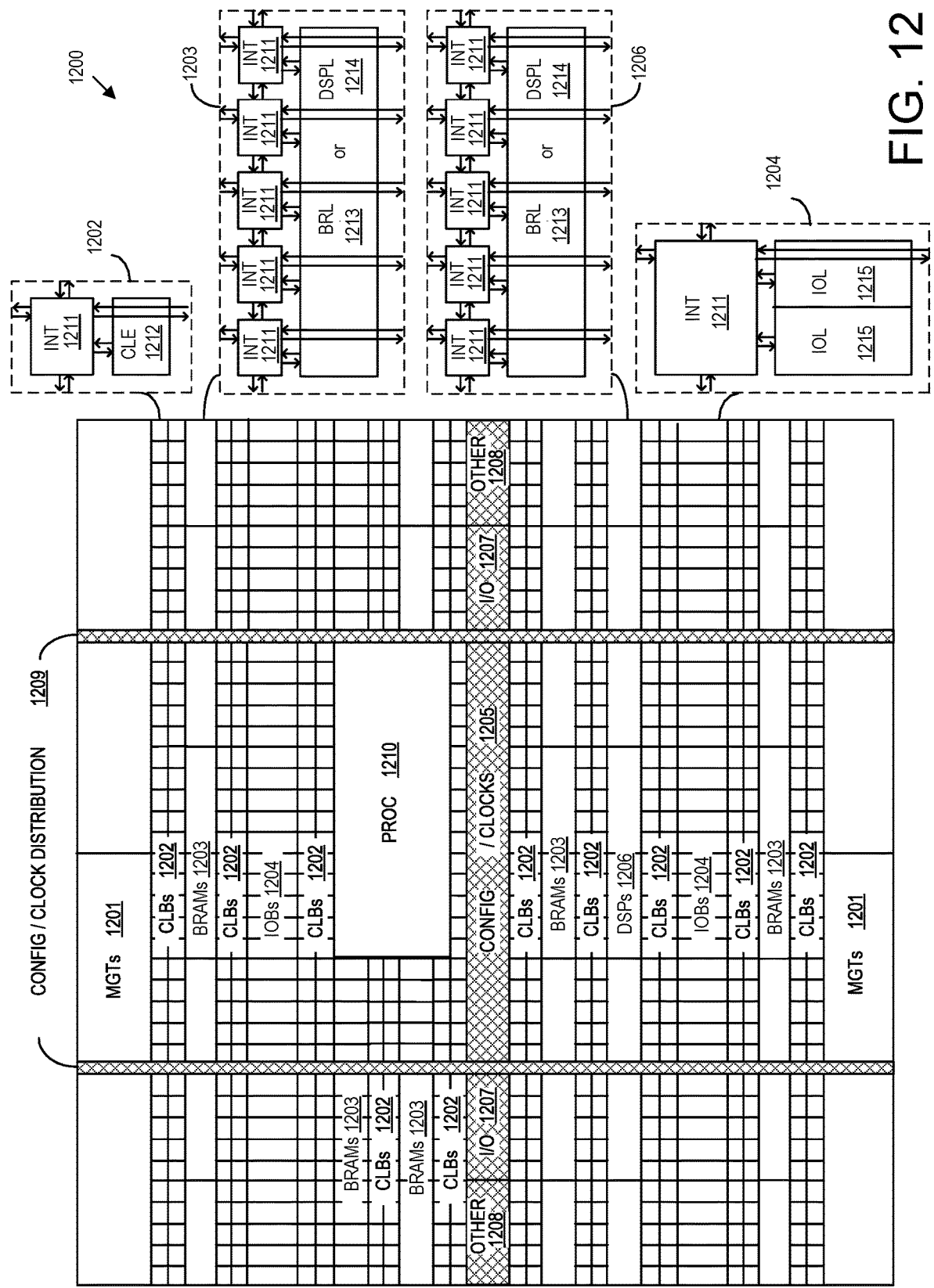
FIG. 12 illustrates an example architecture for a programmable IC.

FIG. 12 illustrates an example architecture 1200 for an IC. In one aspect, architecture 1200 may be implemented within a programmable IC. For example, architecture 1200 may be used to implement a field programmable gate array (FPGA). Architecture 1200 may also be representative of a System-on-Chip (SoC) type of IC. An SoC is an IC that includes a processor that executes program code and one or more other circuits. The other circuits may be implemented as hardwired circuitry, programmable circuitry, and/or a combination thereof. The circuits may operate cooperatively with one another and/or with the processor.

As shown, architecture 1200 includes several different types of programmable circuit, e.g., logic, blocks. For example, architecture 1200 may include a large number of different programmable tiles including multi-gigabit transceivers (MGTs) 1201, configurable logic blocks (CLBs) 1202, random access memory blocks (BRAMs) 1203, input/output blocks (IOBs) 1204, configuration and clocking logic (CONFIG/CLOCKS) 1205, digital signal processing blocks (DSPs) 1206, specialized I/O blocks 1207 (e.g., configuration ports and clock ports), and other programmable logic 1208 such as digital clock managers, analog-to-digital converters, system monitoring logic, and so forth.

In some ICs, each programmable tile includes a programmable interconnect element (INT) 1211 having standardized connections to and from a corresponding INT 1211 in each adjacent tile. Therefore, INTs 1211, taken together, implement the programmable interconnect structure for the illustrated IC. Each INT 1211 also includes the connections to and from the programmable logic element within the same tile, as shown by the examples included at the top of FIG. 12.

For example, a CLB 1202 may include a configurable logic element (CLE) 1212 that may be programmed to implement user logic plus a single INT 1211. A BRAM 1203 may include a BRAM logic element (BRL) 1213 in addition to one or more INTs 1211. Typically, the number of INTs 1211 included in a tile depends on the height of the tile. As pictured, a BRAM tile has the same height as five CLBs, but other numbers (e.g., four) also may be used. A DSP tile 1206 may include a DSP logic element (DSPL) 1214 in addition to an appropriate number of INTs 1211. An 10B 1204 may include, for example, two instances of an I/O logic element (IOL) 1215 in addition to one instance of an INT 1211. The actual I/O pads connected to IOL 1215 may not be confined to the area of IOL 1215.

In the example pictured in FIG. 12, a horizontal area near the center of the die, e.g., formed of regions 1205, 1207, and 1208, may be used for configuration, clock, and other control logic. Vertical areas 1209 extending from this horizontal area may be used to distribute the clocks and configuration signals across the breadth of the programmable IC.

Some ICs utilizing the architecture illustrated in FIG. 12 include additional logic blocks that disrupt the regular columnar structure making up a large part of the IC. The additional logic blocks may be programmable blocks and/or dedicated circuitry. For example, a processor block depicted as PROC 1210 spans several columns of CLBs and BRAMs.

In one aspect, PROC 1210 may be implemented as dedicated circuitry, e.g., as a hardwired processor, that is fabricated as part of the die that implements the programmable circuitry of the IC. PROC 1210 may represent any of a variety of different processor types and/or systems ranging in complexity from an individual processor, e.g., a single core capable of executing program code, to an entire processor system having one or more cores, modules, co-processors, interfaces, or the like.

In another aspect, PROC 1210 may be omitted from architecture 1200 and replaced with one or more of the other varieties of the programmable blocks described. Further, such blocks may be utilized to form a "soft processor" in that the various blocks of programmable circuitry may be used to form a processor that can execute program code as is the case with PROC 1210.

The phrase "programmable circuitry" refers to programmable circuit elements within an IC, e.g., the various programmable or configurable circuit blocks or tiles described herein, as well as the interconnect circuitry that selectively couples the various circuit blocks, tiles, and/or elements according to configuration data that is loaded into the IC. For example, circuit blocks shown in FIG. 12 that are external to PROC 1210 such as CLBs 1202 and BRAMs 1203 are considered programmable circuitry of the IC.

In general, the functionality of programmable circuitry is not established until configuration data is loaded into the IC. A set of configuration bits may be used to program programmable circuitry of an IC such as an FPGA. The configuration bit(s) typically are referred to as a "configuration bitstream." In general, programmable circuitry is not operational or functional without first loading a configuration bitstream into the IC. The configuration bitstream effectively implements a particular circuit design within the programmable circuitry. The circuit design specifies, for example, functional aspects of the programmable circuit blocks and physical connectivity among the various programmable circuit blocks.

Circuitry that is "hardwired" or "hardened," i.e., not programmable, is manufactured as part of the IC. Unlike programmable circuitry, hardwired circuitry or circuit blocks are not implemented after the manufacture of the IC through the loading of a configuration bitstream. Hardwired circuitry is generally considered to have dedicated circuit blocks and interconnects, for example, that are functional without first loading a configuration bitstream into the IC, e.g., PROC 1210.

In some instances, hardwired circuitry may have one or more operational modes that can be set or selected according to register settings or values stored in one or more memory elements within the IC. The operational modes may be set, for example, through the loading of a configuration bitstream into the IC. Despite this ability, hardwired circuitry is not considered programmable circuitry as the hardwired circuitry is operable and has a particular function when manufactured as part of the IC.

In the case of an SoC, the configuration bitstream may specify the circuitry that is to be implemented within the programmable circuitry and the program code that is to be executed by PROC 1210 or a soft processor. In some cases, architecture 1200 includes a dedicated configuration processor that loads the configuration bitstream to the appropriate configuration memory and/or processor memory. The dedicated configuration processor does not execute user-specified program code. In other cases, architecture 1200 may utilize PROC 1210 to receive the configuration bitstream, load the configuration bitstream into appropriate configuration memory, and/or extract program code for execution.

FIG. 12 is intended to illustrate an example architecture that may be used to implement an IC that includes programmable circuitry, e.g., a programmable fabric. For example, the number of logic blocks in a column, the relative width of the columns, the number and order of columns, the types of logic blocks included in the columns, the relative sizes of the logic blocks, and the interconnect/logic implementations included at the top of FIG. 12 are purely illustrative. In an actual IC, for example, more than one adjacent column of CLBs is typically included wherever the CLBs appear, to facilitate the efficient implementation of a user circuit design. The number of adjacent CLB columns, however, may vary with the overall size of the IC. Further, the size and/or positioning of blocks such as PROC 1210 within the IC are for purposes of illustration only and are not intended as limitations.

For purposes of explanation, specific nomenclature is set forth to provide a thorough understanding of the various inventive concepts disclosed herein. The terminology used herein, however, is for the purpose of describing particular aspects of the inventive arrangements only and is not intended to be limiting.

As defined herein, the singular forms "a," "an," and "the" are intended to include the plural forms as well, unless the context clearly indicates otherwise.

As defined herein, the term "approximately" means nearly correct or exact, close in value or amount but not precise. For example, the term "approximately" may mean that the recited characteristic, parameter, or value is within a predetermined amount of the exact characteristic, parameter, or value.

As defined herein, the terms "at least one," "one or more," and "and/or," are open-ended expressions that are both conjunctive and disjunctive in operation unless explicitly stated otherwise. For example, each of the expressions "at least one of A, B, and C," "at least one of A, B, or C," "one or more of A, B, and C," "one or more of A, B, or C," and "A, B, and/or C" means A alone, B alone, C alone, A and B together, A and C together, B and C together, or A, B and C together.

As defined herein, the term "automatically" means without human intervention.

As defined herein, the term "computer readable storage medium" means a storage medium that contains or stores program code for use by or in connection with an instruction execution system, apparatus, or device. As defined herein, a "computer readable storage medium" is not a transitory, propagating signal per se. A computer readable storage medium may be, but is not limited to, an electronic storage device, a magnetic storage device, an optical storage device, an electromagnetic storage device, a semiconductor storage device, or any suitable combination of the foregoing. The various forms of memory, as described herein, are examples of computer readable storage media. A non-exhaustive list of more specific examples of a computer readable storage medium may include: a portable computer diskette, a hard disk, a RAM, a read-only memory (ROM), an erasable programmable read-only memory (EPROM or Flash memory), an electronically erasable programmable read-only memory (EEPROM), a static random access memory (SRAM), a portable compact disc read-only memory (CD-ROM), a digital versatile disk (DVD), a memory stick, a floppy disk, or the like.

As defined herein, the term "if" means "when" or "upon" or "in response to" or "responsive to," depending upon the context. Thus, the phrase "if it is determined" or "if [a stated condition or event] is detected" may be construed to mean "upon determining" or "in response to determining" or "upon detecting [the stated condition or event]" or "in response to detecting [the stated condition or event]" or "responsive to detecting [the stated condition or event]" depending on the context.

As defined herein, the term "responsive to" and similar language as described above, e.g., "if," "when," or "upon," means responding or reacting readily to an action or event. The response or reaction is performed automatically. Thus, if a second action is performed "responsive to" a first action, there is a causal relationship between an occurrence of the first action and an occurrence of the second action. The term "responsive to" indicates the causal relationship.

As defined herein, the term "processor" means at least one hardware circuit. The hardware circuit may be configured to carry out instructions contained in program code. The hardware circuit may be an integrated circuit. Examples of a processor include, but are not limited to, a central processing unit (CPU), an array processor, a vector processor, a digital signal processor (DSP), an FPGA, a programmable logic array (PLA), an ASIC, programmable logic circuitry, and a controller.

As defined herein, the term "substantially" means that the recited characteristic, parameter, or value need not be achieved exactly, but that deviations or variations, including for example, tolerances, measurement error, measurement accuracy limitations, and other factors known to those of skill in the art, may occur in amounts that do not preclude the effect the characteristic was intended to provide.

The terms first, second, etc. may be used herein to describe various elements. These elements should not be limited by these terms, as these terms are only used to distinguish one element from another unless stated otherwise or the context clearly indicates otherwise.

A computer program product may include a computer readable storage medium (or media) having computer readable program instructions thereon for causing a processor to carry out aspects of the inventive arrangements described herein. Within this disclosure, the term "program code" is used interchangeably with the term "computer readable program instructions." Computer readable program instructions described herein may be downloaded to respective computing/processing devices from a computer readable storage medium or to an external computer or external storage device via a network, for example, the Internet, a LAN, a WAN and/or a wireless network. The network may include copper transmission cables, optical transmission fibers, wireless transmission, routers, firewalls, switches, gateway computers and/or edge devices including edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations for the inventive arrangements described herein may be assembler instructions, instruction-set-architecture (ISA) instructions, machine instructions, machine dependent instructions, microcode, firmware instructions, or either source code or object code written in any combination of one or more programming languages, including an object oriented programming language and/or procedural programming languages. Computer readable program instructions may include state-setting data. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a LAN or a WAN, or the connection may be made to an external computer (for example, through the Internet using an Internet Service Provider). In some cases, electronic circuitry including, for example, programmable logic circuitry, an FPGA, or a PLA may execute the computer readable program instructions by utilizing state information of the computer readable program instructions to personalize the electronic circuitry, in order to perform aspects of the inventive arrangements described herein.

Certain aspects of the inventive arrangements are described herein with reference to flowchart illustrations and/or block diagrams of methods, apparatus (systems), and computer program products. It will be understood that each block of the flowchart illustrations and/or block diagrams, and combinations of blocks in the flowchart illustrations and/or block diagrams, may be implemented by computer readable program instructions, e.g., program code.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the operations specified in the flowchart and/or block diagram block or blocks.

The computer readable program instructions may also be loaded onto a computer, other programmable data processing apparatus, or other device to cause a series of operations to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various aspects of the inventive arrangements. In this regard, each block in the flowchart or block diagrams may represent a module, segment, or portion of instructions, which comprises one or more executable instructions for implementing the specified operations.

In some alternative implementations, the operations noted in the blocks may occur out of the order noted in the figures. For example, two blocks shown in succession may be executed substantially concurrently, or the blocks may sometimes be executed in the reverse order, depending upon the functionality involved. In other examples, blocks may be performed generally in increasing numeric order while in still other examples, one or more blocks may be performed in varying order with the results being stored and utilized in subsequent or other blocks that do not immediately follow. It will also be noted that each block of the block diagrams and/or flowchart illustration, and combinations of blocks in the block diagrams and/or flowchart illustration, may be implemented by special purpose hardware-based systems that perform the specified functions or acts or carry out combinations of special purpose hardware and computer instructions.

The corresponding structures, materials, acts, and equivalents of all means or step plus function elements that may be found in the claims below are intended to include any structure, material, or act for performing the function in combination with other claimed elements as specifically claimed.

A device may include a platform implemented in programmable circuitry of the device. The platform may be configured to communicate with a host data processing system. The device may include a first partial reconfiguration region implemented in the programmable circuitry and coupled to the platform. The first partial reconfiguration region may be reserved for implementing user-specified circuitry. The device may include timing insulation circuitry implemented in the programmable circuitry and configured to isolate timing of signals passing between the platform and the first partial reconfiguration region.

In one aspect, the timing insulation circuitry may include a flip-flop on each signal passing between the platform and the first partial reconfiguration region.

In another aspect, the platform may include static platform circuitry. The timing insulation circuitry may be part of the static platform circuitry.

In another aspect, the platform may include a second partial reconfiguration region coupled to the first partial reconfiguration region. The timing insulation circuitry may be implemented between a boundary of the first partial reconfiguration region and a boundary of the second partial reconfiguration region.

In another aspect, the static platform circuitry of the platform may remain unchanged while the second partial reconfiguration region is reconfigured.

In another aspect, the static platform circuitry may remain unchanged while the first partial reconfiguration region is reconfigured.

In another aspect, the platform may include a second partial reconfiguration region coupled to the first partial reconfiguration region. The timing insulation circuitry may be implemented within the second partial reconfiguration region at a boundary of the second partial reconfiguration region adjacent to a boundary of the first partial reconfiguration region and the second partial reconfiguration region.

In another aspect, the timing insulation circuitry may remain unchanged while the second partial reconfiguration region is reconfigured.

In another aspect, the placement and routing of the timing insulation circuitry may remain when circuitry of the platform is modified.

In another aspect, the timing insulation circuitry may remain unchanged while a modified version of the platform is implemented in the device, wherein the modified version of the platform includes a modification of one or more of the signals that pass between the platform and the first partial reconfiguration region.

A method may include providing a platform implemented in programmable circuitry of a device. The platform may be configured to communicate with a host data processing system. The method may include providing a first partial reconfiguration region implemented in the programmable circuitry and coupled to the platform. The first partial reconfiguration region is reserved for implementing user-specified circuitry. The method may include providing timing insulation circuitry implemented in the programmable circuitry and configured to isolate timing of signals passing between the platform and the first partial reconfiguration region. The method may also include implementing a modified version of the platform in the device while keeping the timing insulation circuitry unchanged.

In one aspect, the timing insulation circuitry may include a flip-flop on each signal passing between the platform and the first partial reconfiguration region.

In another aspect, the modified version of the platform may include a modification of one or more of the signals that pass between the platform and the first partial reconfiguration region.

In another aspect, the platform may include static platform circuitry. The timing insulation circuitry may be part of the static platform circuitry.

In another aspect, the platform may include a second partial reconfiguration region coupled to the first partial reconfiguration region. The timing insulation circuitry may be implemented between a boundary of the first partial reconfiguration region and a boundary of the second partial reconfiguration region.

In another aspect, the static platform circuitry of the platform may remain unchanged while the second partial reconfiguration region is reconfigured.

In another aspect, the static platform circuitry may remain unchanged while the first partial reconfiguration region is reconfigured.

In another aspect, the platform may include a second partial reconfiguration region coupled to the first partial reconfiguration region. The timing insulation circuitry may be implemented within the second partial reconfiguration region at a boundary of the second partial reconfiguration region adjacent to a boundary of the first partial reconfiguration region and the second partial reconfiguration region.

In another aspect, the timing insulation circuitry may remain unchanged while the second partial reconfiguration region is reconfigured.

In another aspect, the placement and routing of the timing insulation circuitry may remain unchanged when circuitry of the platform is modified.

The description of the inventive arrangements provided herein is for purposes of illustration and is not intended to be exhaustive or limited to the form and examples disclosed. The terminology used herein was chosen to explain the principles of the inventive arrangements, the practical application or technical improvement over technologies found in the marketplace, and/or to enable others of ordinary skill in the art to understand the inventive arrangements disclosed herein. Modifications and variations may be apparent to those of ordinary skill in the art without departing from the scope and spirit of the described inventive arrangements. Accordingly, reference should be made to the following claims, rather than to the foregoing disclosure, as indicating the scope of such features and implementations.

What is claimed is:

1. A device, comprising:
a platform implemented in programmable circuitry of the device, wherein the platform includes a static platform circuitry having a bus endpoint and a platform partial reconfiguration region including a direct memory access (DMA) engine coupled to the bus endpoint, an interconnect coupled to the DMA engine, and a memory controller coupled to the DMA engine, wherein the platform partial reconfiguration region is configured to connect user-specified circuitry with the bus endpoint and an off-chip memory local to the device and distinct from a memory of a host data processing system;
a first partial reconfiguration region implemented in the programmable circuitry and coupled to the platform, wherein the first partial reconfiguration region is reserved for implementing the user-specified circuitry;
timing insulation circuitry implemented in the programmable circuitry and configured to isolate timing of signals passing between the platform partial reconfiguration region of the platform and the first partial reconfiguration region; and
wherein the bus endpoint is configured to maintain a communication link with the host data processing system while the first partial reconfiguration region or the platform partial reconfiguration region or both the first partial reconfiguration region and the platform partial reconfiguration region are reconfigured.

2. The device of claim 1, wherein the timing insulation circuitry includes a flip-flop on each signal passing between the platform and the first partial reconfiguration region.

3. The device of claim 1, wherein the timing insulation circuitry is part of the static platform circuitry.

4. The device of claim 3, wherein the timing insulation circuitry is implemented between a boundary of the first partial reconfiguration region and a boundary of the platform partial reconfiguration region.

5. The device of claim 4, wherein the static platform circuitry of the platform remains unchanged while the platform partial reconfiguration region is reconfigured.

6. The device of claim 4, wherein the static platform circuitry remains unchanged while the first partial reconfiguration region is reconfigured.

7. The device of claim 1, wherein the timing insulation circuitry is implemented within the platform partial reconfiguration region at a boundary of the platform partial reconfiguration region adjacent to a boundary of the first partial reconfiguration region and the platform partial reconfiguration region.

8. The device of claim 7, wherein the timing insulation circuitry remains unchanged while the platform partial reconfiguration region is reconfigured.

9. The device of claim 1, wherein placement and routing of the timing insulation circuitry is unchanged when circuitry of the platform is modified.

10. The device of claim 1, wherein the timing insulation circuitry remains unchanged while a modified version of the platform is implemented in the device, wherein the modified version of the platform includes a modification of one or more of the signals that pass between the platform and the first partial reconfiguration region.

11. A method, comprising:
providing a platform implemented in programmable circuitry of a device, wherein the platform includes a static platform circuitry having a bus endpoint and a platform partial reconfiguration region including a direct memory access (DMA) engine coupled to the bus endpoint, an interconnect coupled to the DMA engine, and a memory controller coupled to the DMA engine, wherein the platform partial reconfiguration region is configured to connect user-specified circuitry with the bus endpoint and an off-chip memory local to the device and distinct from a memory of a host data processing system;

providing a first partial reconfiguration region implemented in the programmable circuitry and coupled to the platform, wherein the first partial reconfiguration region is reserved for implementing the user-specified circuitry;

providing timing insulation circuitry implemented in the programmable circuitry and configured to isolate timing of signals passing between the platform partial reconfiguration region of the platform and the first partial reconfiguration region; and implementing a modified version of the platform circuitry in the device while keeping the timing insulation circuitry unchanged; and wherein the bus endpoint is configured to maintain a communication link with the host data processing system while the first partial reconfiguration region or the platform partial reconfiguration region or both the first partial reconfiguration region and the platform partial reconfiguration region are reconfigured.

12. The method of claim 11, wherein the timing insulation circuitry includes a flip-flop on each signal passing between the platform and the first partial reconfiguration region.

13. The method of claim 11, wherein the modified version of the platform includes a modification of one or more of the signals that pass between the platform and the first partial reconfiguration region.

14. The method of claim 11, wherein the timing insulation circuitry is part of the static platform circuitry.

15. The method of claim 14, wherein the platform includes a platform partial reconfiguration region coupled to the first partial reconfiguration region, and wherein the timing insulation circuitry is implemented between a boundary of the first partial reconfiguration region and a boundary of the platform partial reconfiguration region.

16. The method of claim 15, wherein the static platform circuitry of the platform remains unchanged while the platform partial reconfiguration region is reconfigured.

17. The method of claim 15, wherein the static platform circuitry remains unchanged while the first partial reconfiguration region is reconfigured.

18. The method of claim 11, wherein the timing insulation circuitry is implemented within the platform partial reconfiguration region at a boundary of the platform partial reconfiguration region adjacent to a boundary of the first partial reconfiguration region and the platform partial reconfiguration region.

19. The method of claim 18, wherein the timing insulation circuitry remains unchanged while the platform partial reconfiguration region is reconfigured.

20. The method of claim 11, wherein placement and routing of the timing insulation circuitry is unchanged when circuitry of the platform is modified.

* * * * *